United States Patent [19]

Luetzow

[11] Patent Number: 4,489,231
[45] Date of Patent: Dec. 18, 1984

[54] METHOD FOR PREPARING ELECTRICAL CONDUCTOR

[75] Inventor: Edwin J. Luetzow, Farmington, Minn.

[73] Assignee: TelTec Inc., Farmington, Minn.

[21] Appl. No.: 419,037

[22] Filed: Sep. 16, 1982

Related U.S. Application Data

[63] Continuation-in-part of Ser. No. 188,717, Sep. 19, 1980, abandoned.

[51] Int. Cl.³ .............................................. B23K 9/00
[52] U.S. Cl. ............................. 219/137 R; 219/56.22; 219/58
[58] Field of Search ............... 219/58, 56, 56.1, 56.22, 219/56.21, 86.1, 137 R, 118, 100

[56] References Cited

U.S. PATENT DOCUMENTS

| | | | |
|---|---|---|---|
| 3,394,241 | 7/1968 | Sparrow et al. | 219/118 |
| 3,524,963 | 8/1970 | Swengel | 219/100 |
| 3,703,623 | 11/1972 | Swengel, Sr. | 219/56.22 |
| 3,826,000 | 7/1974 | Du Rocher et al. | 219/137 R |
| 4,038,743 | 8/1977 | Du Rocher et al. | 219/137 R |
| 4,091,259 | 5/1978 | Tanaka et al. | 219/58 |
| 4,098,447 | 7/1978 | Edson et al. | 219/86.1 |
| 4,142,083 | 2/1979 | Du Rocher | 219/58 |

OTHER PUBLICATIONS

P. P. King et al., "Arc-Percussive Butt Welding of Fine Wire Conductors", *Welding Journal*, 2/1965, pp. 100-105.

*Primary Examiner*—Clifford C. Shaw
*Attorney, Agent, or Firm*—Hugh D. Jaeger

[57] ABSTRACT

A method of preparing stranded electrical conductors for subsequent attachment to the terminal pad of an electrical device or component whereby the tip portion of said conductors are fused to form a coalescent bead. The stranded wire conductor is placed in a holding fixture and the end surface thereof is brought into engagement with an electrode member. The electrode is then displaced from the end of the wire by a predetermined gap distance. Subsequently, the air or other gas in the gap is ionized by a high frequency, high voltage electrical field, creating a low impedance for a low voltage current source. The current flowing from this source, through the electrode and through the gap is sufficient to fuse the strands of the conductor being treated at the tip end thereof and when cooled, a tiny coalescent bead of metal is formed. A suitable inert gas may also be introduced into the gap during the process to prevent oxidation of the metal during the fusion step.

2 Claims, 3 Drawing Figures

METHOD FOR PREPARING ELECTRICAL CONDUCTOR

CROSS-REFERENCES TO COPENDING APPLICATIONS

The application is a continuation-in-part of Ser. No. 188,717, filed Sept. 19, 1980, now abandoned.

BACKGROUND OF THE INVENTION

I. Field of the Invention

This invention relates generally to a method for preparing stranded wires to facilitate their later use in connecting electrical circuit components, and more specifically to a method for forming a small, solid, generally spherical bead at the tip end of the conductor.

II. Description of the Prior Art

In making connections to electrical circuit components, it is often advantageous to use a brazing step wherein an electrical conductor is joined to a conductive pad area on the component as by spot welding or brazing. Where pad or terminal areas on the component are closely spaced, it is important that the bonding operation not lead to short circuiting of adjacent terminal pads. This problem is particularly acute where multi-strand electrical wire is being joined to a pad area. It is found that when the head of the spot welder is brought into contact with the multi-stranded wires to be joined to the pad, the strands are squeezed and tend to spread out or fray. These frayed ends may then bridge the gap between two adjacent pad or terminal areas on a substrate to which the wire is being joined.

The foregoing problem is further aggravated when the conductor being joined to a pad area is a multi-stranded phosphor-bronze alloy. While phosphor-bronze affords the advantage of being quite resilient and able to withstand repeated flexures, it presents a significant problem when attempts are made to weld or otherwise affix a stripped end of such multi-standed conductors to a terminal pad. The individual strands of phosphor-bronze conductors tend to be somewhat stiff and will fan out when a welding tip is pressed against the conductor during an attachment step. Thus, where the terminals on the electrical device to which the wire is being attached are closely spaced, this fanning out of the ends of the individual strands in a stranded conductor can result in short circuits between adjacent terminals.

Where a multi-stranded conductor is to be soldered to a terminal pad, it has been common practice to first dip the conductor in liquid solder to "tin" the tip. This tends to render the tip end inflexible and subject to fracture after repeated flexures. For this reason, as well as for others, fusion bonding has found widespread use.

The method of the present invention is designed to obviate problems occasioned by fraying of the stranded wires. Before the attachment step is performed, the wires to be joined to the electrical device are pretreated whereby a small cohesive bead is formed at the tip of the multi-stranded conductor. This bead holds all of the individual strands together with no frayed ends extending therefrom. In carrying out the invention a portion of the insulation on the multi-stranded conductor is stripped from the ends thereof to be beaded and this stripped portion is gripped in a holding fixture. Next, the exposed end of the stranded wire to be treated is moved into contact with a tungsten electrode and this electrode is then moved away from the tip of the stranded wire by a predetermined gap distance. Next, a high voltage, high frequency field is established across the gap to form a plasma breakdown such that a charged capacitor may be made to discharge through the electrode, the gap and the wire being treated. This discharge current is sufficient to cause the individual strands at the tip of the conductor to be melted. Upon cooling, a tiny, generally spherical bead of conductive metal is formed at the tip of the wire without any projecting, frayed ends exiting from the bead.

Now, when the wire so pre-treated is to be joined to a conductive pad area on a circuit component or the like in a brazing step, relatively high pressures can be applied forcing the bead against the terminal pad without fear that the application of this pressure will cause fraying of the strands of the electrical conductor being joined to the pad.

It has also been found expedient to introduce an inert gas into the gap between the electrode and the wire's tip prior to the application of the discharge current to prevent oxidation of the metal comprising the wire. This prevents splattering of the metal particles and leads to the improved formation of a small spherical bead.

SUMMARY OF THE INVENTION

The general purpose of the present invention is to form a weld ball on the end of a small guage stranded wire, the weld ball which can subsequently used as a terminal. The weld ball formed is a sphere approximately 1.5 times the diameter of the wire.

According to one embodiment of the present invention, there is provided a process of positioning an end of a wire between two electrodes, striking an arc, and passing a current to fuse the ends into a ball due to tension of molten metal in an inert atmosphere.

It is accordingly the principal object of the present invention to provide an improved method for pre-treating stranded electrical wires to prevent the ends thereof from fraying during subsequent handling steps.

Another object of the invention is to provide a method whereby a tiny coalescent bead of conductive material may be formed at the extreme tip end of a multi-strand electrical conductor.

A further object of the invention is to provide a simple, low-cost method of pre-treating stranded electrical conductors to facilitate their later attachment to electrical terminal pads.

These and other objects and advantages of the invention will become apparent to those skilled in the art from the following detailed description of the invention and from the accompanying drawings.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the FIGURES thereof and wherein.

DESCRIPTION OF THE PREFERRED EMBODIMENTS

Figure 1:
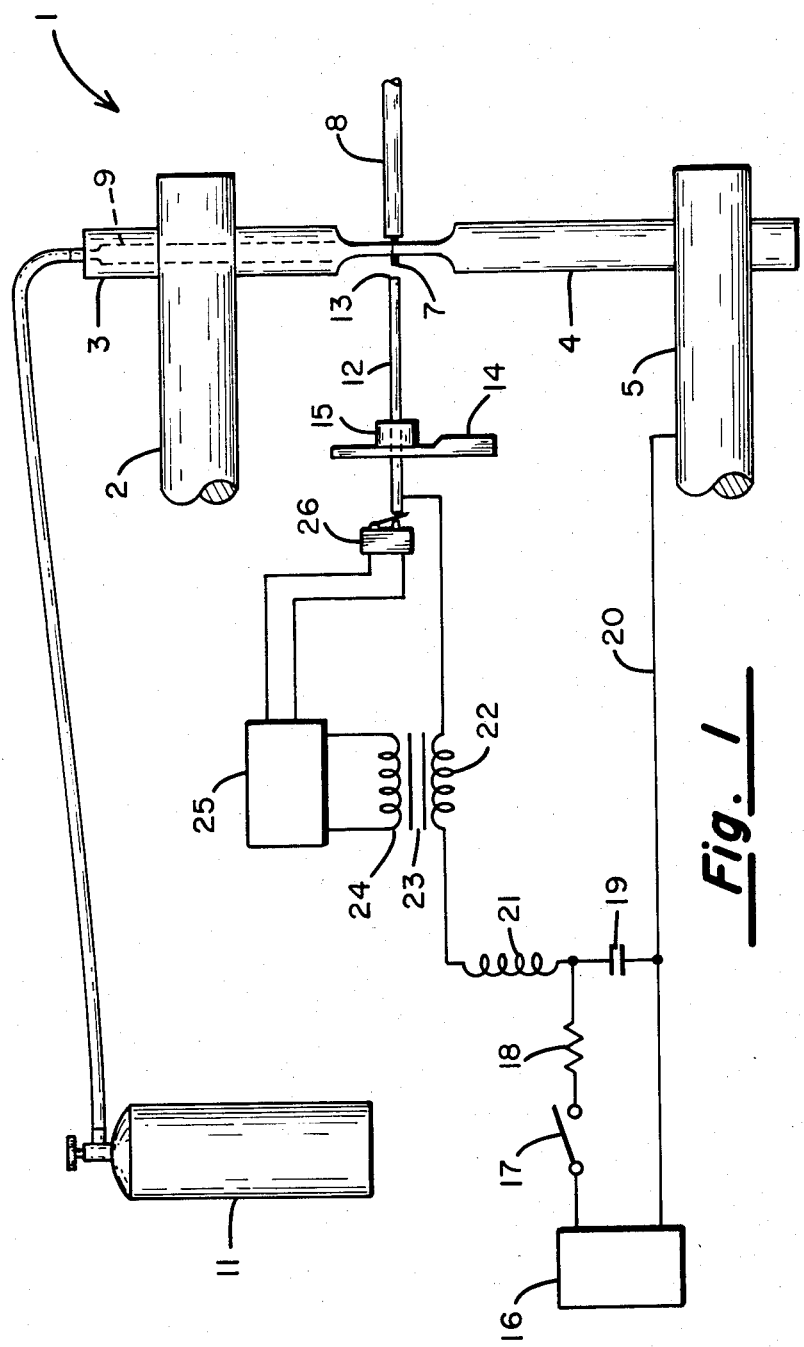
FIG. 1 is a schematic electrical/mechanical diagram of apparatus which may be used to carry out the method of the present invention.

Referring first to FIG. 1, there is indicated generally by numeral 1 an apparatus whereby the method of the present invention may be carried out. The apparatus comprises an upper electrode holding member 2 which is arranged to support and hold an upper clamp electrode member 3 for reciprocal, up/down movement. Cooperating with the upper clamp electrode 3 is a lower clamp electrode 4 which is also mounted in a lower electrode holder member 5.

Figure 2:
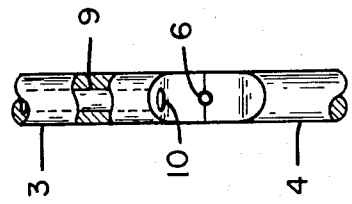
FIG. 2 is a side view of a portion of the upper and lower clamping electrodes of FIG. 1; and, FIG. 3 is a block flow diagram helpful in understanding the steps of the method comprising the present invention.

FIG. 2 is a side view of the portion of the upper and lower clamp members and, as can be seen, each has a generally semicircular recess formed in the mating edges thereof such that when the two are brought together, they define a generally circular opening 6.

Referring again to FIG. 1, the upper and lower clamps 3 and 4 are illustrated as being closed upon the uninsulated end portion 7 of an otherwise insulated multi-stranded electrical conductor 8. The semicircular recesses formed in the mating surfaces of the upper clamp electrode 3 and the lower clamp electrode 4 are such that the aperture 6 firmly grips the side surfaces of the exposed stranded conductor 7, ensuring good electrical and mechanical contact with the conductor. The upper and lower clamp members 3 and 4 are removable from their respective holders 1 and 5 so that different clamp members may be utilized to accommodate stranded conductors of differing gauges.

The upper clamp electrode 3 is shown to include a longitudinal bore 9 which terminates at an opening 10 (FIG. 2) proximate the point at which the wire to be treated is gripped. The bore 9 is arranged to be supplied with an inert gas such as $CO_2$, argon, or other suitable gas from a tank 11.

An electrode member 12, preferably formed from tungsten, is mechanically positioned so that its end surface 13 may be made to abut the corresponding end surface of the stranded conductors 7 when the wire 8 is inserted between the upper and lower clamp electrodes. Associated with the electrode 12 is a cam 14 which cooperates with a cam follower 15 affixed to the electrode 12. Movement of the cam 14 between first and second positions causes the tip of the electrode 13 to be moved into a stop position with respect to the wire 8 and thence to a second position removed therefrom by a predetermined gap distance. Thus, when the cam 14 is in the retracted position as illustrated, a gap exists between the forward end 13 of the tungsten electrode 12 and the end surface of the clamped stranded conductor. When the cam 14 is moved upward, it cooperates with the cam follower 15 to close the gap.

The apparatus further includes a low voltage power supply 16 which is adapted to be coupled through a suitable switching device 17 and a resistor 18 to a relatively large capacitor 19. The switching device 17 may be either a single pole, single throw mechanical switch as illustrated or alternatively may comprise a solid-state device such as a silicon controlled rectifier. The power supply 16 has its return terminal connected by a conductor 20 to the lower electrode holder 5 which is preferably formed from copper or other suitable conductive material, as is the lower clamp electrode 4. One side of the capacitor 19 is connected to this return conductor 20 and its other terminal is coupled through an inductor 21 and the secondary winding 22 of a transformer 23 to the tungsten electrode 12. The primary winding 24 of the transformer 23 is connected across the output terminals of a high frequency pulse generator. The amplitude of the pulses from the pulse generator 25 developed across the secondary winding 22 are such that the AC component of the voltage developed across the gap between the end 13 of the tungsten electrode 12 and the tip of the wire to be treated 7 will result in ionization of the gas existing in that gap as introduced from the supply tank 11. Disposed in the path of travel of the electrode 12 is a Microswitch ®26. This switch serves to detect the relative positioning of the electrode with respect to the wire being treated and to provide a control signal to the high frequency pulse generator for applying the ionizing voltage to the gap. It is also contemplated that this same position sensing switch may be used to control a solenoid valve (not shown) associated with the tank 11 so that the gas will be introduced into the zone of the gap at the appropriate time in the cycle. Further, where a SCR is used as the switching device 17, the operation of the Microswitch 26 may be used to trigger the SCR at an appropriate time.

Now that the structural features of the apparatus have been described, consideration will be given to the operation whereby the method of the present invention can be practiced.

MODE OF OPERATION

First, the cam 14 is in its elevated position such that the end 13 of the tungsten electrode 12 is in its rightmost orientation relative to the side surfaces of the upper and lower clamp electrodes 3 and 4. The clamp electrodes are separated slightly and the stripped end of a multi-strand conductor 8 is inserted through the opening 6 until its end abuts the end 13 of the electrode 12. The upper and lower clamp electrodes are then closed about the stripped end portion of the wire to be treated, thereby firmly holding that conductive portion and ensuring good electrical contact between the wire and the clamp electrodes. Next, the switch 17 is closed and the capacitor 19 is charged through the resistor 18 to a predetermined voltage. Subsequently, the cam 14 is moved to its lowered position (the one illustrated) whereby the tungsten electrode 12 moves away from its position in abutment with the end surface of the exposed stranded wires 7 and after the full gap is established, the Microswitch 26 closes to turn on the high frequency pulse generator 25. The pulse generator and its associated output transformer 23 cause a high frequency, high voltage to be developed across the now-existing gap such that ionization of the gas from the source 11 takes place. Once this gas becomes ionized, it presents a relatively low impedance and the capacitor 19 discharges through the inductor 21, the secondary winding 22, the tungsten electrode 12, and the gap and is returned through the lower clamp electrode 4, its holder 5 and the conductor 20. This discharge current from the capacitor 19 is sufficiently great that the very tip portions of the multi-strands comprising the conductor 8 are fused and when the discharge is complete, the molten metal forms a small coalescent bead on the extreme tip of the wire 8.

At this point, the cam 14 is again elevated which moves the electrode forward, shuts off the pulse generator 25, closes the switch 17 to effect recharging of the capacitor 19, opens the closed jaws of the clamping electrodes allowing a new conductor to be inserted and the cycle may now be repeated.

The cam is designed to permit the creation of a gap between the electrode 12 and the end of the wire 8 in the range of from 0.015 to 0.025, a gap of 0.020 perhaps being optimum. The pulse generator 25 may operate typically at a frequency of about 50 KHz. The power supply 16 is preferably adjustable so that the apparatus may be used to pre-treat stranded conductor wires of differing sizes. In the same fashion, the capacitor 19 is also a variable parameter. For example, when the machine is operating on 28 gauge stranded wire, a DC power supply voltage of about 125 volts feeding a 400 microfarad capacitor produces satisfactory results. When operating on 20 gauge stranded wire, a DC power supply voltage of 325 volts feeding a 3,000 microfarad capacitor is found to provide the desired beading on the wire tip. For 18 gauge stranded wire, a DC power supply voltage of 400 volts driving a 4,000 microfarad capacitor is typically required.

Figure 3:
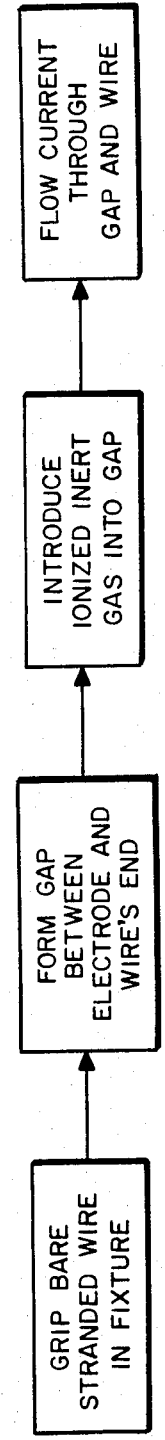

Referring next to FIG. 3, it can be seen that the basic steps in the method of the present invention comprises the gripping of the bare stranded wire in a suitable fixture, forming a gap between an electrode and the end portion of the stranded wire, introducing an ionized inert gas into that gap and allowing a substantial current to flow through the gap and wire whereby the end portion of the wire is momentarily fused and then allowed to solidify into a cohesive bead. Wires pretreated in accordance with this method may more readily be later secured to terminal pads of other electrical devices such as integrated circuits, printed circuit boards, electrical terminal pins, etc. by brazing, soldering or other bonding techniques without fear that frayed ends of the wires may cause unwanted shorts.

The welding ball provides for welding of low restivity metals such as cooper, aluminum, silves, and alloys thereof. The ball provides for constriction resistance for concentrating $I^2R$ heating in the weld area.

The welding ball provides a spherical surface for weld initiating surface and required point of contact weld such as stranded wire to a terminal thereby avoiding strand problems flying about the weld area. Cooper weld ball to a cooper terminal is praticularly practical in this type of application. The weld ball in effect forms a weld nugget for a metallurgical bond. The weld ball is much smaller than the prior art metal balls which in effect were a forging or metal moving operation providing a mechanical termination while the present invention provides an electrical ball termination.

The welding ball is formed on stranded wire forming the welding termination eliminating the paint brush effect. The weld ball is 1.2-1.5 times the size of the wire with 1.5 being a natural zise. With 22 ga. wire of 0.020 stranded, the ball is 0.030-0.031 in diameter. For 20 ga. wire, the ball is 0.040 inches in diameter. The weld ball is a linear progression in wire diameter and provides the thermal mass for welding. The weld ball is global in size and the shape is a function of surface tension at the temperature that the material attains for minimum surface at maximum volume providing the sphere. Of course, the mass of the sphere provides a consideration that the weld ball can always be reformed into a terminal or the like as required for microelectronics.

The weld ball can then be resistance welded onto a terminal pad such as through capacitance-discharge welding using an erergy level of 20 W/sec, pressure of 30 grams, and thereby flattening the ball to 50% to provide metal on upsetting of the weld by way of example and for purposes of illustration only.

The invention has been described herein in considerable detail, in order to comply with the Patent Statutes and to provide those skilled in the art with information needed to apply the novel principles, and to construct and use such specialized components as may be required. However, it is to be understood that the invention can be carried out by specifically different equipment and devices, and that various modifications, both as to equipment details and operating procedures can be effected without departing from the scope of the invention itself.

What is claimed is:

1. Process for preparing an end of a multi-strand conductor with a welding ball for attachment to a terminal member, said process comprising:
   a. positioning an end portion of a multi-strand conductor adjacent to and touching a horizontal tungsten electrode of an electrode fixture;
   b. gripping said portion with opposing clamp members including opposing aperture surfaces for gripping side surfaces of said conductor adjacent to said end in a substantially horizontal plane and substantially parallel to said electrode;
   c. flowing of a $CO^2$ inert gas down a bore of an upper of said opposing clamp members, said bore terminating where said conductor is gripped, and said inert gas flowing at said termination of said bore and at said gripped conductor across said end of said conductor;
   d. moving said horizontal electrode away from said end of said conductor forming a gap therebetween;
   e. striking an arc across said gap and creating a high conductance path of ionized plasma through said inert gas; and,
   f. passing current of at least a value to fuse said multi-strands into a coalescent weld ball at said end of said conductor having a diameter in the range of 1-1.5 the diameter of said conductor.

2. Process for preparing an end of a conductor with a welding ball for attachment to a terminal member, said process comprising:
   a. positioning an end portion of a conductor adjacent to and touching a horizontal tungsten electrode of an electrode fixture;
   b. Gripping said portion with opposing clamp members including opposing aperture surfaces for gripping side surfaces of said conductor adjacent to said end in a substantially horizontal plan and substantially parallel to said electrode;
   c. flowing of a $CO^2$ inert gas down a bore of an upper of said opposing clamp members, said bore terminating where said conductor is gripped, and said inert gas flowing at said termination of said bore and at said gripped conductor across said end of said conductor;
   d. moving said horizontal electrode away from said end of said conductor forming a small gap therebetween;
   e. striking an arc across said gap and creating a high conductance path of ionized plasma through said inert gas; and
   f. passing current of a value to form a coalescent bead of conductive metal at a tip of said conductor, said coalescent bead having a diameter in the range of 1-1.5 the diameter of said conductor.

* * * * *